United States Patent [19]
Ward et al.

[11] Patent Number: 5,617,048
[45] Date of Patent: Apr. 1, 1997

[54] HYSTERETIC POWER-UP CIRCUIT

[75] Inventors: Michael G. Ward, Saco; Roy L. Yarbrough, Hiram; Jay R. Chapin, South Portland, all of Me.

[73] Assignee: National Semiconductor Corporation, Santa Clara, Calif.

[21] Appl. No.: 614,911

[22] Filed: Mar. 13, 1996

Related U.S. Application Data

[63] Continuation of Ser. No. 308,148, Sep. 19, 1994, abandoned.

[51] Int. Cl.$^6$ .................................................. H03K 3/037
[52] U.S. Cl. ........................ 327/143; 327/205; 327/545
[58] Field of Search .................................. 327/142, 143, 327/198, 205, 50, 78, 77, 545, 374, 375, 376, 377, 404, 405, 392, 309, 325, 326, 583, 584, 585, 206, 314

[56] References Cited

U.S. PATENT DOCUMENTS

| | | | |
|---|---|---|---|
| 3,985,970 | 10/1976 | Lerault et al. | 327/205 |
| 4,213,068 | 7/1980 | Ahmed | 327/375 |
| 4,254,347 | 3/1981 | Ray | 327/545 |
| 4,405,871 | 9/1983 | Buurma et al. | 327/143 |
| 4,481,430 | 11/1984 | Houk | 327/530 |
| 4,697,103 | 9/1987 | Ferris et al. | 327/575 |
| 4,754,158 | 6/1988 | Halberstein | 327/504 |
| 4,967,102 | 10/1990 | Mahler | 327/143 |
| 5,051,611 | 9/1991 | Kantz | 327/143 |
| 5,111,136 | 5/1992 | Kawashima | 327/77 |

*Primary Examiner*—Timothy P. Callahan
*Assistant Examiner*—Eunja Shin
*Attorney, Agent, or Firm*—Thomas L. Bohan; Chris A. Caseiro

[57] ABSTRACT

A power-up circuit with hysteretic characteristics for regulating the activation of one or more output buffers of an extended logic circuit. The hysteresis of the power-up circuit of the invention permits turn on of a switching transistor of the circuit at one threshold voltage level and maintains the active state of that switching transistor until a second lower threshold voltage level. The hysteresis is achieved by providing two separate and electrically isolated control paths that are connected to the control node of the switching transistor. The first control path includes a plurality of diode devices designed to regulate the power supply level required to turn on the switching transistor. The second control path also includes diode devices but in lesser numbers so that, once the switching transistor is turned on by the first control path, it remains on in spite of fluctuations at the power supply rail.

16 Claims, 5 Drawing Sheets

HYSTERETIC POWER-UP CIRCUIT

This is a continuation of application Ser. No. 308,148, filed Sep. 19, 1994, now abandoned.

BACKGROUND OF THE INVENTION

1. Field of the Invention

This invention relates generally to the field of sub-circuits used to synchronize the energizing of the various parts of an extended circuit. Such a subcircuit is characterized as a "power-up circuit," and serves to delay the application of electrical power at power-up until the level of voltage available is high enough to ensure the proper operation of the circuit. More particularly, it is a circuit that delays the application of power to the output pullup and pulldown stages in output buffers until those stages can be controlled by the rest of the output buffer and associated circuitry. More particularly yet, the present invention provides a means of delaying circuit activation until the rising power-supply-voltage is sufficiently high to ensure that the output buffer is placed in a definite state before its pullup and pulldown stages are energized. Yet more particularly, the present invention introduces a hysteresis into the energizing/de-energizing process such that the turn-on-threshold-voltage marking the point at which power supply voltage is applied to the extended circuit as the power supply voltage is rising, is significantly higher than the turn-off-threshold-voltage marking the point at which power supply voltage is removed from the extended circuit as the power supply voltage is falling. This ensures that a relatively high turn-on-threshold-voltage can be set, without a concern that the circuit will be de-energized by normal fluctuations in the applied power supply voltage.

Another sub-field in which the circuit of the present invention can be categorized is that of reset circuits, i.e., circuits used to set to logic-low the levels of a group of logic stages in an extended circuit or, more generally, to set the levels of the logic stages to definite values, logic-low or logic-high.

2. Description of the Prior Art

In general, power is supplied to an extended logic circuit by a power supply connected across the circuit. This usually is accomplished by connecting the low-potential power rail of the logic circuit to ground and connecting the high-potential power rail to the output of the power supply. The high-potential power rail voltage is usually referred to as $V_{cc}$, and the low-potential power rail as GND. Normally the power supply is part of the circuitry and when ac power is provided to the power supply the output voltage of that power supply will not instantaneously increase to the full design voltage for the high-potential power rail of the logic circuit. Rather, the voltage output of the power supply, $V_{ps}$, will commence at ground level and ramp up more or less linearly to the design voltage over a period on the order of milliseconds. Problems arise because long before $V_{ps}$ brings the high-potential power rail up to the level where the entire circuit is operating properly, the circuit will become active. This can result in various stages being placed in indeterminate states, as opposed to being in one of the two well-defined binary states. This in turn can result in excess power dissipation both within the circuit and from the common bus to which the circuit is ultimately coupled.

In general, each three-state output buffer connected to a common bus will be regulated by an output enable gate which can place the buffer in its disabled (high-Z) state regardless of the other signals to the buffer. This provides a direct way to ensure that the buffers are all disabled during the potentially disruptive period during which the power supply voltage is ramping up. A signal from a power-up circuit is simply coupled to the output enable gate of each buffer, a power-up circuit designed to provide a disabling signal through that output enable gate during the period of ramp-up. That is, a power-up circuit is used which will generate at an early stage in the ramping up of $V_{ps}$ a signal which can be used to hold the output buffer disabled. In other words, the power-up circuit is a "fix" added to the main circuit to make up for the fact that the main circuit cannot generate a disabling signal soon enough. The power-up circuit will generate an output voltage $V_{PU}$ which is in a definite logic state by the time that $V_{ps}$ reaches the level at which any parts of the extended logic circuit can start conducting. That definite-logic-state signal can then be used to ensure that the output logic buffer is disabled. A generic array incorporating a power-up circuit is depicted in FIG. 1, which shows the output enable gate (OEG) to be an OR gate with one input from the power-up circuit and one input from that part of the circuit which is supposed to generate the output enabling signal once the circuit is in operation and that particular buffer is supposed to be active. With the layout of FIG. 1, it can be seen that the output of the power-up circuit, $V_{PU}$, must be logic-high throughout that part of the $V_{ps}$ ramp-up for which the buffer is vulnerable. For transistor-transistor logic (TTL), this will be the range from about $2V_{BE}$ to $4V_{BE}$, with $V_{BE}$ being defined as the voltage drop across the base/emitter junction of a conducting bipolar transistor (i.e., the bias required to cause forward current across that pn junction). Thus the requirement is that the power-up circuit put out a logic-high signal while $V_{ps}$ is varying from $2V_{BE}$ to $4V_{BE}$ during ramp-up, and that it then be locked at logic low so as to return control of the buffer to nOE. Although this has been stated in relation to the specific schematic circuit of FIG. 1, it can be seen that the main requirement is that the power-up circuit coupled into the circuit to be protected must somehow generate a well-defined binary signal during the period of vulnerability during which the rest of the circuit, if left unguarded, could generate a series of mixed states, neither logic high nor logic low.

Early power-up circuits are described in Houk et al. (U.S. Pat. 4,481,430, issued 1984) and in Kantz (U.S. Pat. 5,051,611, issued in 1991). The basic circuit of Houk is shown in FIG. 2 (Prior Art). It can be seen that as $V_{ps}$ ramps up from ground, the power-up output voltage $V_{PU}$ will first follow $V_{ps}$, since there will be no current through resistor R3 and hence no voltage drop across that resistor. At some point on that ramp-up—depending on the way in which the power-up circuit is coupled to the rest of the circuit, and in particular to the output enable gate—the output buffer will be disabled. Although the exact voltage at which that happens can only be determined from a consideration of the specifics of that coupling, it is easy to determine the value of $V_p$, for which the power-up circuit yields control. It is when transistor Q1 turns on. Transistor Q1 will be non-conducting until $V_{ps}$ is high enough to cause forward conduction through diodes D1 and D2 and hence provide base drive to Q1. Even after both diodes D1 and D2 are conducting, Q1 will not conduct until the drop across R2 equals $V_{BE}$, the voltage required across the base-emitter junction of Q1 to turn on the transistor. The "forward" base-emitter voltage drop will be taken to be the same across all transistors, and also to be the forward-conduction voltage drop for all the circuit diodes (which are generally bipolar transistors themselves with the collector and base nodes tied together). Thus it can be seen that Q1 will turn on when $V_{ps}$ reaches a voltage $V_{BE}[3 +R1/R2]$, or about $4V_{BE}$ when the R1 and R2 resistors are comparable to one another. When Q1 turns on the output of the power-up circuit will fall to $V_{sat}$ (the collector-emitter drop across a conducting bipolar transistor of the circuit) and will remain there as long as $V_{ps}$ remains above $V_{BE}[3+R1/R2]$. For this duration, $V_{PU}$ will be locked at logic-low. The gate to which $V_{PU}$ is connected—generally an OR gate as shown in FIG. 1—is wired so that a logiclow $V_{PU}$ does not have any effect on the state of the output buffer. It can be seen, then, that for $V_{ps}>V_{BE}[3+R1/R2]$ the power-up circuit cuts out (cedes control of the buffer). The problem with the invention of Houk et al. is that it does not allow for fluctuations in the high-potential power rail voltage which fluctuations, though large, are not inconsistent with proper operation of the circuit. These fluctuations will occur for a number of reasons and are a normal feature of a properly-functioning circuit. In particular, fluctuations in the high-potential power rail voltage which brings that voltage as low as $4V_{BE}$ above ground are not inconsistent with proper functioning of the circuit; nevertheless, the power-up circuit of Houk et al. will shut down the circuit when such a fluctuation occurs.

The circuit of Kantz addresses the susceptibility of earlier power-up circuits to shut down circuits in the presence of normal operational $V_{ps}$ fluctuations. It does this by introducing a hysteresis such that, once the power-up circuit has relinquished control over the extended circuit at the $V_{ps}$ threshold $V_{UTh}$, it will not reassert control until $V_{ps}$ has fallen below a different threshold $V_{DTh}$, where $V_{DTh}<V_{UTh}$. FIG. 3 depicts the essence of the power-up circuit of Kantz. As $V_{ps}$ increases from ground potential the diode stack is at first not conducting; transistor Q3 receives no base drive and hence is non-conducting. The output voltage of the power-up circuit is equal to $V_{ps}$ during this interval, as with that of Houk et al. and, like that of Houk et al. will cause the buffer to be disabled once a certain value for $V_{ps}$—typically around $2V_{BE}$—is reached. Note that once $V_{ps}$ exceeds $V_{BE}$, transistor Q2 turns on. However, the output voltage $V_{PU}$ continues to track $V_{ps}$, since the base current through Q2 will result in negligible voltage drop across resistor R7. There will, however, be current through R4, and a corresponding voltage drop across R4 with Q2 conducting. Initially, this current all passes through Q2. When $V_{ps}$ reaches a certain voltage, however, the diode stack consisting of D3 and D4 will start conducting and the current through R4 will then be the sum of the respective currents through the diode stack branch and through Q2. As $V_{ps}$ continues to increase, it will pass the threshold $V_{UTh}$ at which base drive is supplied to Q3; at this point, $V_{PU}$ will drop to $V_{SAT}$, turning Q2 off. The threshold $V_{UTh}$ is the point at which the power-up circuit of Kantz yields control over the buffer. The turning off of Q2 at $V_{UTh}$ is essential to the hysteresis effect in Kantz. Now all of the current through R4 passes through the diode stack. Consequently, when $V_{ps}$ decreases-either during power-down or during a transitory fluctuation-it can reach a voltage $V_{DTh}$ lower than $V_{UTh}$ before the base voltage of Q3 falls below $V_{BE}$ causing Q3 to turn off and hence the power-up circuit to shut down the output buffer. Because Kantz allows the power-up threshold voltage $V_{UTh}$ to be set higher than the power-down threshold voltage $V_{DTh}$, it permits $V_{UTh}$ to be set higher than would be desirable when one has to select a single threshold which is to be a compromise between (1) providing adequate protection during power-up and (2) avoiding shutdowns for minor fluctuations in the power supply voltage.

Although the power-up circuit of Kantz allows separation of the threshold voltages $V_{UTh}$ and $V_{DTh}$, it is limited with regard to the fixing of the values of those threshold voltages by means other than selection of alternative resistance values. This is of particular concern given the types of variations observed in fabricated resistors, wherein actual resistance values can deviate by as much as 30% from design values. Any alternative means used to change $V_{UTh}$ and $V_{DTh}$, such as by adding supplemental diode means to the circuit branch including transistor Q2 could bring the power-up circuit outside the range of acceptable operating conditions, particularly as required power supply levels are reduced. What is therefore needed is a simple bipolar power-up circuit with hysteresis.

SUMMARY OF INVENTION

The present invention is a circuit which can be used to ensure that logic stages are placed in definite logic states. Thus, the circuit can be used to reset a logic stage to logic-low; a plurality of such circuits can serve to reset an extended circuit of logic stages. When the circuit of the present invention is utilized in these ways it will be coupled to the circuit-to-be-controlled through various intermediary circuitry. One application of the circuit of the present invention is that of holding a three-state buffer disabled during the power-up transient. When used in that manner, it is important that provision be made to prevent the power-up circuit from disabling the buffer for minor fluctuations in the power-supply-voltage.

The heart of the circuit of the present invention is a switching transistor the base of which is coupled to the power-supply-voltage (i.e., the high-potential power rail $V_{cc}$) via two quasi-independent control branches. It is this provision of two distinct paths for base drive of the switching transistor that provide the hysteresis of the circuit of the present invention. Both paths include a diode stack, with the stack being shorter in the second control path than it is in the first. The first control path determines the value of $V_{ps}$ at which the switching transistor turns on—thereby causing the power-up circuit to yield control—and the second control path determines the (lower) threshold value for $V_{ps}$ at which the switching transistor turns off—thereby causing the power-up circuit to re-assert control. Through this design, the control node of the switching transistor is made less immune to turn off caused by fluctuations at the high-potential power rail, whether caused by loading, noise, or temperature deviations.

As previously indicated, each of the control paths includes diode means that set the threshold at which the switching transistor becomes and remains operable. Setting of those two non-equal threshold potentials may be customized to particular design requirements through selection of diodes or diode-wired bipolar transistors having specific voltage-drop characteristics. In addition, other voltage-dividing devices such as resistors may be incorporated into the control paths to further define the threshold potentials for turn on and turn off of the switching transistor. These and other advantages of the present invention will become apparent to those skilled in the art upon review of the accompanying drawings, detailed description, and the appended claims.

PREFERRED EMBODIMENT

Figure 1:
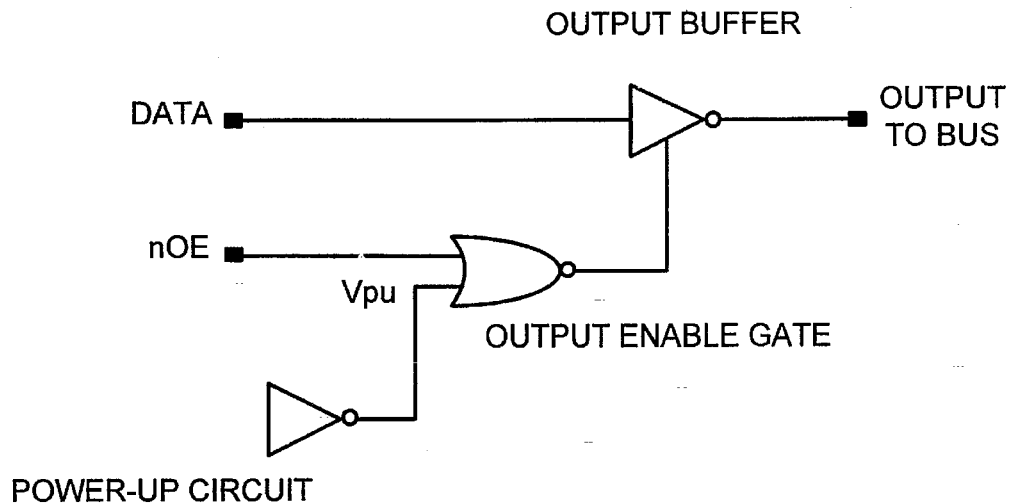
FIG. 1 (prior art) Generic block diagram showing how a power-up circuit may be introduced so as to provide protection to a buffer designed to provide data output to a common bus.
Figure 2:
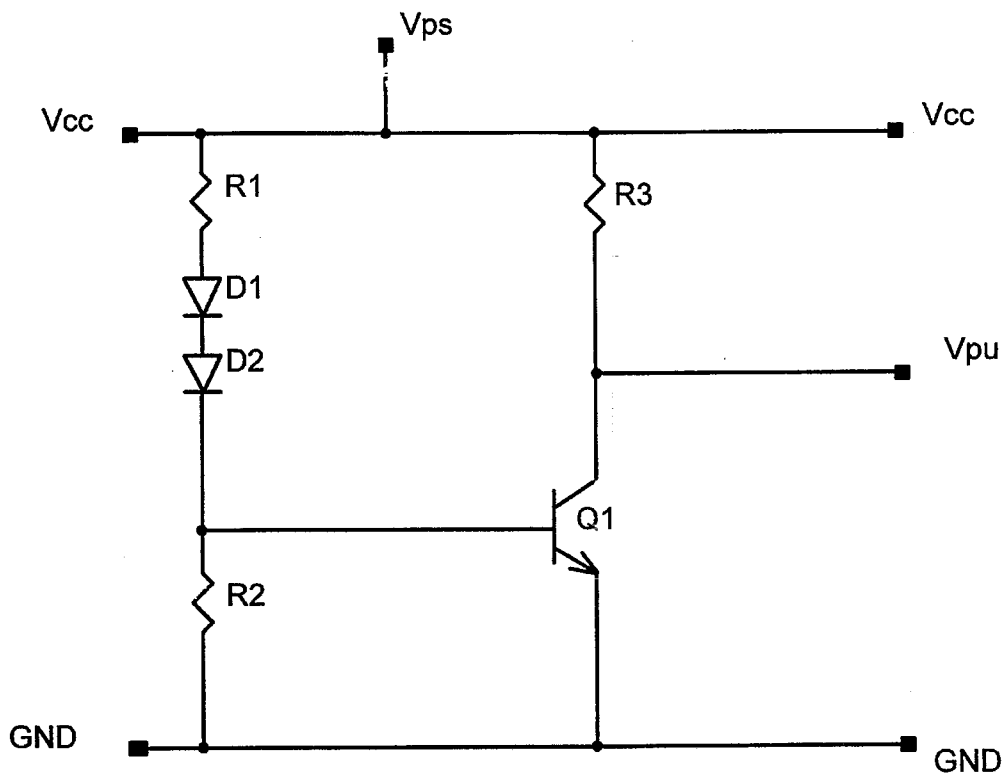
FIG. 2 (prior art) A prior-art power-up circuit.
Figure 3:
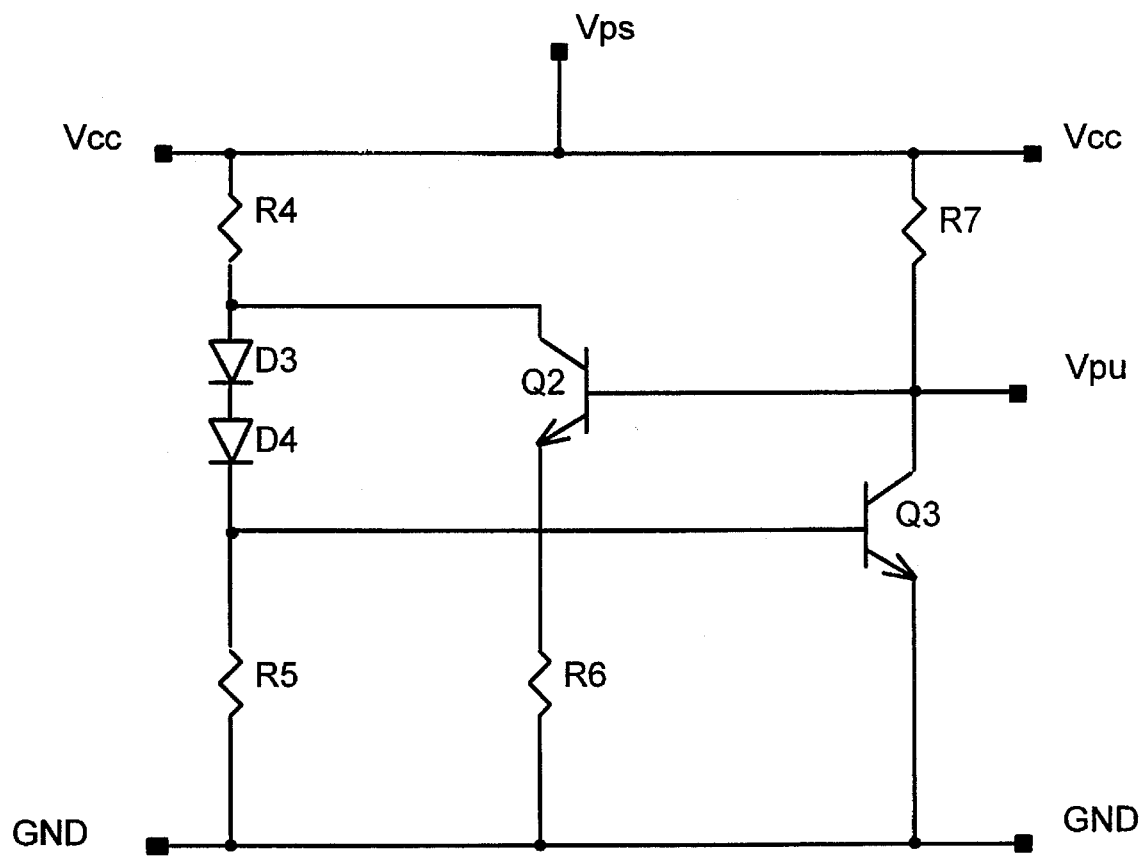
FIG. 3 (prior art) A prior power-up circuit containing a means to separate the power-up threshold voltage from the power-down threshold voltage.
Figure 4:
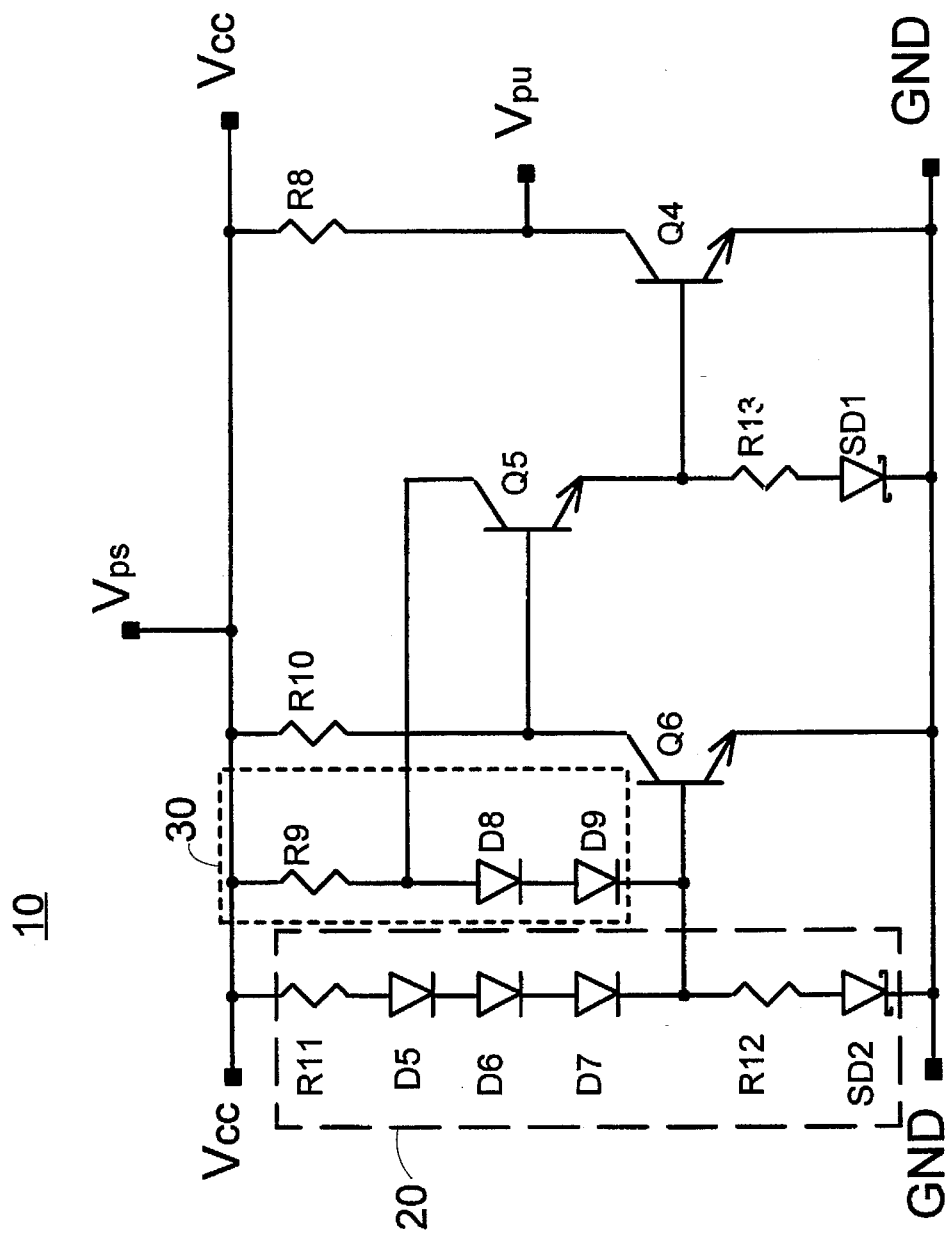
FIG. 4 One version of the power-up circuit of the present invention isolated from the rest of the extended circuit.

FIG. 4 shows the Preferred Embodiment of the present invention as an isolated power-up circuit 10 with a power-up output $V_{PU}$ available for control purposes. The power-up circuit 10 includes a first turn-on path 20 and a second turn-on path 30 used to control the, operation of a switching transistor Q6. It is to be noted that the power-up circuit 10 lies between a high-potential power rail $V_{cc}$ and a low-potential power rail GND. These same power rails also power the extended circuit with which the power-up circuit 10 will be used. The low-potential power rail GND is typically tied to ground; the high-potential power rail $V_{cc}$ is powered by a power supply (not shown) which provides current at a power-supply-voltage $V_{ps}$ to the high-potential power rail $V_{cc}$ at a node $V_{ps}$. The switching transistor Q6 regulates the voltage at power-up output $V_{pu}$ by controlling first-output-transistor Q5 and second-output-transistor Q4. Components of the first turn-on path 20 determine an up-threshold voltage $V_{ThU}$ on high-potential power rail $V_{cc}$ at which the switching transistor Q6 will turn on; components of the second turn-on path 30 determine a down-threshold voltage $V_{ThD}$ on high-potential power rail $V_{cc}$ at which switching transistor Q6 will subsequently turn off, all as will be described herein.

In the Preferred Embodiment of the present invention, the first turn-on path 20 includes a first resistor R11 having a high-potential node coupled directly to the high-potential power rail $V_{cc}$, and a low-potential node coupled to a forward-biased three-diode stack consisting of diodes D5, D6, and D7 in series. A low-potential node of the three-diode stack is coupled to a base node of the switching transistor Q6 and to a high-potential node of a second resistor R12, which is coupled to the low-potential power rail GND through a first current regulating diode SD2 so as to ensure that the base node of switching transistor Q6 remains at an appropriate voltage level. Alternatively, the first current-regulating diode SD2 may be deleted and the second resistor R12 coupled directly to the low-potential power rail GND.

The second turn-on path 30 plays a role in controlling the switching transistor Q6 only after the first turn-on path 20 has caused the switching transistor Q6 to turn on. The second turn-on path 30 couples the base of the switching transistor Q6 to the high-potential power rail $V_{cc}$ through a two-diode stack in series with a third resistor R9, wherein the third resistor R9 lies between the two-diode stack and the high-potential power rail $V_{cc}$. The low-potential node of the third resistor R9 is also coupled directly to a collector node of the first-output-transistor Q5. The second turn-on path 30 thus provides a control path that is distinct from the first turn-on path 20. It is to be understood that diodes D5–D9, while shown as simple pn-junction diodes, may be other diode means, such as bipolar transistors having their collector and base nodes tied together.

A base node of the first-output-transistor Q5 is coupled to the high-potential power rail $V_{cc}$ through a fourth resistor R10 and also to a collector node of the switching transistor Q6. Thus, the first-output-transistor Q5 turns on when the voltage on the high-potential power rail $V_{cc}$ reaches a voltage level high enough to ensure that there is base drive for the first-output-transistor Q5. From FIG. 4, it can be seen that this occurs when the voltage on the high-potential power rail $V_{cc}$ (supplied by the power-supply-voltage $V_{ps}$) reaches $2V_{BE}$, where $V_{BE}$ is the forward drop across a conducting pn junction, taken to be the same for all of the pn junctions in this circuit. The first-output-transistor Q5 turns off when the switching transistor Q6 turns on. A collector node of the second-output-transistor Q4 is coupled directly to the power-up output $V_{PU}$, which in turn is connected to the high-potential power rail $V_{cc}$ through output resistor R8. With continuing reference to FIG. 4, it can be seen that when the first-output-transistor Q5 is on, the second-output-transistor Q4 is also on. When the first-output-transistor Q5 is off, the second-output-transistor Q4 is also off, as the emitter node of first-output-transistor Q5 and the base node of the second-output-transistor Q4 are coupled to a second current-regulating circuit branch, preferably including a current-regulating resistor R13 and a second-current-regulating diode SD1, which pulls the base of the second-output-transistor Q4 to ground in the absence of base drive from the collector of the first-output-transistor Q5.

Thus, with continuing reference to FIG. 4, it can be seen that, as the power supply voltage $V_{ps}$ starts to increase from ground level, the power-up output $V_{PU}$ will at first follow the power-supply voltage $V_{ps}$ since the second-output-transistor Q4 will be non-conducting at that point, receiving no base drive until the power-supply voltage $V_{ps}$ has increased to approximately $2V_{BE}$ so as to turn on both the first-output-transistor Q5 and the second-output-transistor Q4. Once the second-output-transistor Q4 is conducting, the power-up output $V_{PU}$ drops to $V_{SAT}$, the voltage across the output resistor R8 becoming $V_{ps}$–$V_{SAT}$. At the same time, the collector voltage of the first-output-transistor Q5 becomes $V_{BE}$+$V_{SAT}$, lower than the voltage needed for forward conduction through the two-diode stack. Even after this level (approximately $2V_{BE}$) for the power-supply voltage $V_{ps}$ is reached, there will not be forward current conduction through the three-diode stack. However, as the power-supply voltage $V_{ps}$ continues to increase, it will reach an up-threshold voltage $V_{UTh}$ around $4V_{BE}$ which will cause the switching transistor Q6 to turn on. Note that with the base of the witching transistor Q6 at $V_{BE}$ the presence of the first regulating diode SD2 ensures that there will be no significant current through the second resistor R12. (That is, the available voltage drop across the first-regulating diode SD2 will be <$V_{BE}$, and hence incapable of supporting significant forward conduction.) This means that relatively little current is required to pass through the R12/SD2 branch in order to ensure that the base of the switching transistor Q6 is maintained at $V_{BE}$.

When the switching transistor Q6 is turned on, the base of the first-output-transistor Q5 is pulled down to less than $V_{BE}$, turning off both the first-output-transistor Q5 and the second-output-transistor Q4. This in turn has two effects. One is to pull the power-up output $V_{PU}$ back to the power-supply voltage $V_{ps}$; the other is to return the voltage at the collector of the first-output-transistor Q5 back to the point where forward conduction can occur through the two-diode stack. This means that base drive is now supplied to the switching transistor Q6 through both the three-diode stack and the two-diode stack, providing alternate paths by which the voltage at the base of the switching transistor Q6 is held at $V_{BE}$. This is the key to the hysteresis in the present invention, permitting the switching transistor Q6, once on, to remain on even though the power-supply-voltage $V_{ps}$ drops below the up-threshold $V_{ThU}$.

Figure 5:
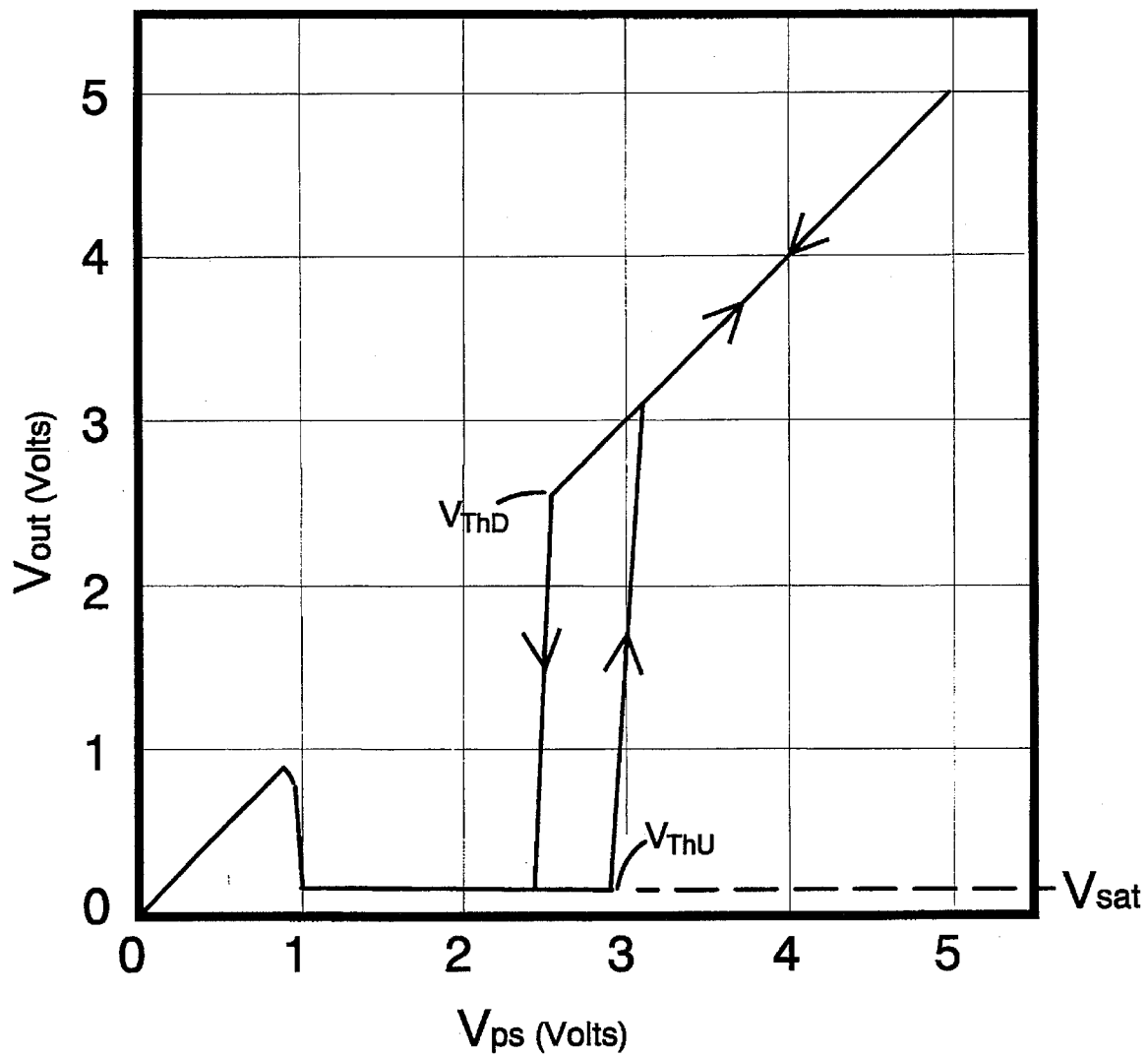
FIG. 5 Graph of the output of the power-up circuit of the present invention as a function of the power supply ramp up and ramp down.

Whenever the power-supply voltage $V_{ps}$ (and hence the voltage on the high-potential power rail $V_{cc}$) falls below the up-threshold voltage $V_{UTh}$—because of power-down or a transitory fluctuation-the current through the three-diode stack will fall to zero. Nevertheless, current through the two-diode stack will continue to provide base drive for the switching transistor Q6 and hence to ensure that first-output-transistor Q5 and second-output-transistor Q4 remain non-conducting, and consequently that the power-up output $V_{PU}$, remains at the power-supply voltage $V_{ps}$. For the second-output-transistor Q4 to turn on (and drop the power-up output $V_{PU}$ to $V_{SAT}$) once it has been turned off, it is necessary that the power-supply voltage $V_{ps}$ fall below the down-threshold voltage $V_{DTh}$ (approximately $3V_{BE}$) so that current through the two-diode stack ceases depriving the switching transistor Q6 of base drive. Once that happens, the power-up output $V_{PU}$ will be held low until the power-supply voltage $V_{ps}$ once again exceeds the up-threshold voltage $V_{UTh}$. FIG. 5 is a plot of the power-up output $V_{PU}$ as a function of the power-supply voltage $V_{ps}$, showing the hysteresis between ramping-up, where the power-supply voltage $V_{ps}$ is increasing, and ramping-down (or fluctuating down), where the power-supply voltage $V_{ps}$ is decreasing after having been high enough to make the power-up output $V_{PU}$ equal the power-supply voltage $V_{ps}$.

Figure 6:
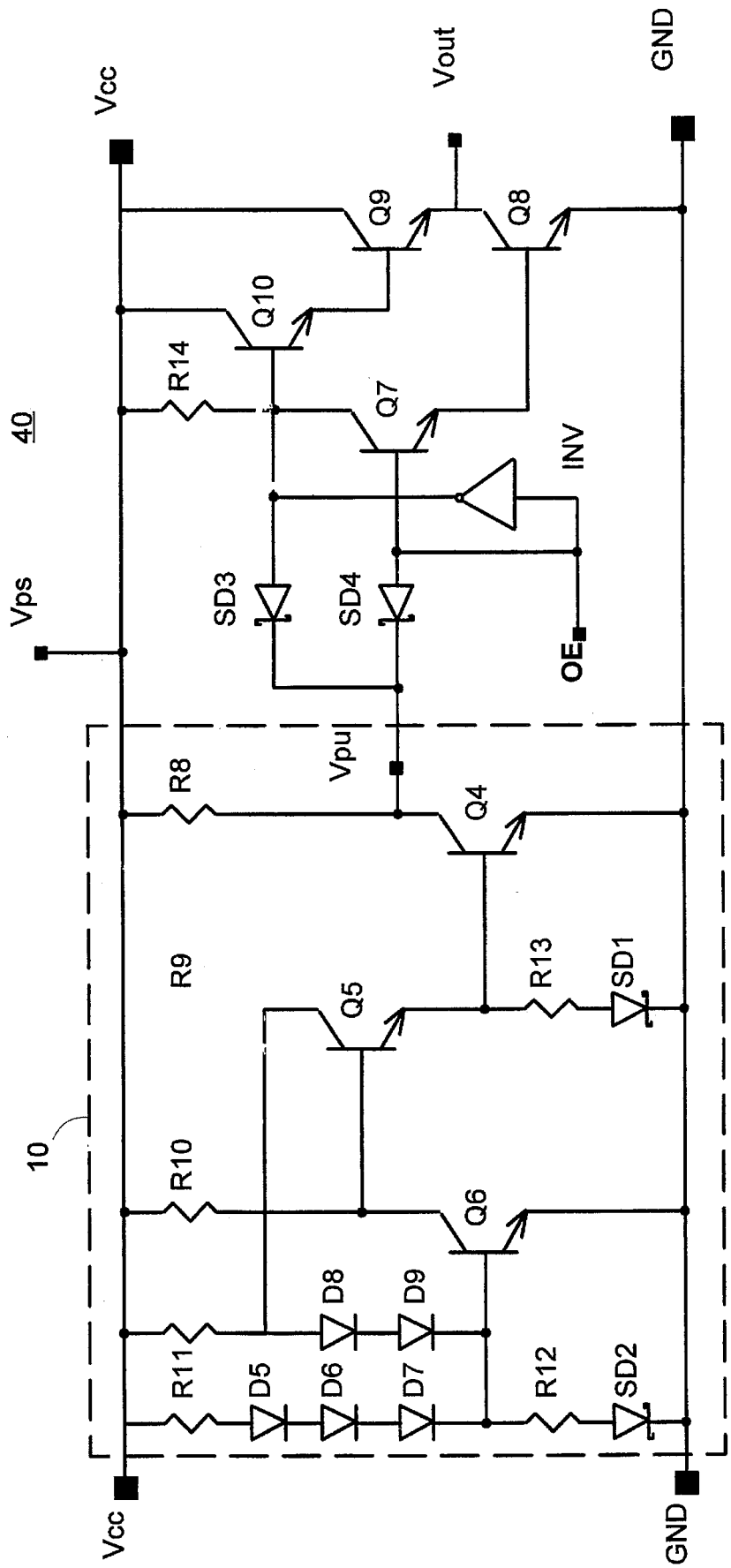
FIG. 6 The power-up circuit of the present invention in its Preferred Embodiment coupled to an extended logic circuit.

FIG. 6 depicts the Preferred Embodiment of the present invention incorporated into an extended circuit 40 including a pullup transistor Q9, a pullup control transistor Q10, a pulldown transistor Q8, a pulldown-control-transistor Q7, and an output node $V_{OUT}$, typically used for connecting to a common bus (not shown). During non-disabled operation, input OE determines whether the circuit 40 will appear current-sinking or current-sourcing at the output node $V_{OUT}$. However, during the interval that the power-up circuit 10 exerts control, it is irrelevant what signal is present at the input OE.

With continuing reference to FIG. 6 it can be seen how the power-up output $V_{PU}$ of the power-up circuit 10 holds off both the pullup transistor Q9 and the pulldown transistor Q8 for as long as the power-supply voltage $V_{ps}$ on the high-potential power rail $V_{cc}$ is insufficient for normal operation of the circuit. As the power-supply-voltage $V_{ps}$, ramping up from ground, reaches $2V_{BE}$ the first output transistor Q5 and the second output transistor Q4 both turn on. This causes the power-up output voltage $V_{PU}$ to drop to $V_{SAT}$. (See FIG. 5.) Because the power-up output $V_{PU}$ is tied to a base node of the pullup-control-transistor Q10 through a pullup control diode SD3 and the power-up output is connected directly to the "negative" side of the pullup control diode SD3, the base node of the pullup-control-transistor will fall to approximately $V_{BE}+V_{SAT}$ when this happens. Since, as can be seen from FIG. 6, a base node voltage of at least $2V_{BE}$ is required to keep the pullup-control-transistor Q10 conducting, this will cause the pullup-control-transistor Q10 to turn off and, as a consequence, the pullup transistor Q9 will also turn off. Note in particular that a logic-low signal applied to the input OE will not make any difference, since that voltage will in effect be discharged through the first pullup control diode SD3. Similarly, as long as the power-up-output-voltage $V_{PU}$ is at $V_{SAT}$ the pulldown-control-transistor Q7 and hence the pulldown transistor Q8 itself will both be held off, again regardless of what signal is applied through the input OE.

In the alternative, once the power-up output voltage $V_{PU}$ again rises to $V_{ps}$ (as shown on FIG. 5), both the pullup control diode SD3 and the pulldown control diode SD4 will be seen to be blocking (reverse-biased), thus permitting the input OE to determine whether the output node $V_{OUT}$ will be current-sourcing or current-sinking.

Although the Preferred Embodiment of the present invention has been described in detail in terms of its application as a power-up circuit, this description is merely illustrative. Those skilled in the art will readily see other ways in which the basic invention can be realized and applied.

We claim:

1. A power-up circuit for synchronizing the activation of one or more components of an extended logic circuit, said power-up circuit comprising:

a. a switching transistor coupled to output means;

b. a first control path including a first diode means set having two or more diode means coupled between a high-potential power rail and a control node of said switching transistor; and c. a second control path including a second diode means set having one or more diode means coupled between said high-potential power rail and said control node of said switching transistor, wherein a node between said second diode means set and said high-potential power rail is coupled to said output means;

wherein said output means is an output transistor set including a first bipolar transistor and a second bipolar transistor, and said switching transistor is a third bipolar transistor having a collector node coupled to a base node of said second bipolar transistor, wherein an emitter node of said second bipolar transistor is coupled to a base node of said first bipolar transistor, and wherein a collector node of said first bipolar transistor is coupled to an output node of said power-up circuit.

2. The power-up circuit as claimed in claim 1 with said first diode means set comprising three diode-wired bipolar transistors in series, with a high-potential node of said first diode means set coupled to said high-potential power rail and a low-potential node of said first diode means set coupled to a base node of said third bipolar transistor.

3. The power-up circuit as claimed in claim 2 wherein said second diode means set includes two diode-wired bipolar transistors in series, with high-potential node of said second diode means set coupled to said high-potential power rail and a low-potential node of said second diode means set coupled to said base node of said third bipolar transistor.

4. The power-up circuit as claimed in claim 2 wherein said second diode means set includes two pn diodes in series, with a high-potential node of said second diode means set coupled to said high-potential power rail and a low-potential node of said second diode means set coupled to said base node of said third bipolar transistor.

5. The power-up circuit as claimed in claim 1 with said second diode means set comprising two diode-wired bipolar transistors in series, with a high-potential node of said second diode means set coupled to said high-potential power rail and a low-potential node of said second diode means set coupled to a base node of said third bipolar transistor.

6. The power-up circuit as claimed in claim 5 wherein said first diode means set includes three diode-wired bipolar transistors in series, with a high-potential node of said first diode means set coupled to said high-potential power rail and a low-potential node of said first diode means set coupled to said base node of said third bipolar transistor.

7. The power-up circuit as claimed in claim 5 wherein said first diode means set includes three pn diodes in series, with a high-potential node of said first diode means set coupled to said high-potential power rail and a low-potential node of said first diode means set coupled to said base node of said third bipolar transistor.

8. A method for synchronizing the activation of one or more components of an extended logic circuit, said method comprising the steps of:
   a. coupling a first control path and a second control path to a control node of a switching transistor, wherein said first control path includes three diode-wired bipolar transistors in a first diode means set and said second control path includes one or two diode means in a second diode means set;
   b. regulating via said first control path the threshold voltage at which said switching transistor turns on;
   c. regulating via said second control path the threshold voltage at which said switching transistor turns off;
   d. coupling said switching transistor to output control means, wherein said output control means is couplable to said one or more components of said extended logic circuit; and
   e. coupling a high-potential node of said first diode means set to a high-potential power rail and a low-potential node of said first diode means set to said control node of said switching transistor.

9. The method as claimed in claim 8 wherein said second diode means set of said second control path includes two diode-wired bipolar transistors, said method further comprising the step of coupling high-potential node of said set of two diode-wired bipolar transistors to said high-potential power rail and a low-potential node of said set of two diode-wired bipolar transistors to said control node of said switching transistor.

10. A reset-circuit for placing a logic stage in a well-defined binary state, said reset-circuit comprising:
   a. a switching transistor coupled to output means;
   b. a first control path including a first diode means set having two or more diode means coupled between a high-potential power rail and a control node of said switching transistor; and
   c. a second control path including a second diode means set having one or more diode means coupled between said high-potential power rail and said control node of said switching transistor, wherein a node between said second diode means set and said high-potential power rail is coupled to said output means;

wherein said output means is an output transistor set including a first bipolar transistor and a second bipolar transistor, and said switching transistor is a third bipolar transistor having a collector node coupled to a base node of said second bipolar transistor, wherein an emitter node of said second bipolar transistor is coupled to a base node of said first bipolar transistor, and wherein a collector node of said first bipolar transistor is coupled to an output node of said power-up circuit.

11. The reset-circuit as claimed in claim 10 with said first diode means set comprising three diode-wired bipolar transistors in series, with a high-potential node of said first diode means set coupled to said high-potential power rail and a low-potential node of said first diode means set is coupled to a base node of said third bipolar transistor.

12. The reset-circuit as claimed in claim 11 wherein said second diode means set includes two diode-wired bipolar transistors in series, with a high-potential node of said second diode means set coupled to said high-potential power rail and a low-potential node of said second diode means set coupled to said base node of said third bipolar transistor.

13. The power-up circuit as claimed in claim 4 wherein said high-potential node of said second diode means set is coupled to a collector node of said second bipolar transistor.

14. The method as claimed in claim 9 wherein said high-potential node of said second diode means set is coupled to said output control means.

15. The reset-circuit as claimed in claim 12 wherein said high-potential node of said second diode means set is coupled to a collector node of said second bipolar transistor.

16. A power-up circuit for synchronizing the activation of one or more components of an extended logic circuit, said power-up circuit comprising:
   a. a switching transistor coupled to output means;
   b. a first control path including a first diode set having two or more diodes coupled between a high-potential power rail and a control node of said switching transistor; and
   c. a second control path including a second diode set having one or more diodes coupled between said high-potential power rail and said control node of said switching transistor, said second diode set being coupled through a resistor to said high-potential power rail, wherein a node between said second diode set and said resistor is coupled to said output means.

\* \* \* \* \*